(12) United States Patent
Burke et al.

(10) Patent No.: US 7,173,294 B1
(45) Date of Patent: Feb. 6, 2007

(54) IMAGE SENSOR WITH REDUCED SENSITIVITY TO GAMMA RAYS

(75) Inventors: Barry E. Burke, Lexington, MA (US); Robert K. Reich, Tyngsborough, MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 232 days.

(21) Appl. No.: 11/005,515

(22) Filed: Dec. 6, 2004

(51) Int. Cl.
*H01L 27/148* (2006.01)

(52) U.S. Cl. .................... 257/216; 257/223; 257/228; 257/231

(58) Field of Classification Search ............... 257/216, 257/219, 222, 223, 225, 228, 231, E27.15
See application file for complete search history.

(56) References Cited

U.S. PATENT DOCUMENTS

| | | | | |
|---|---|---|---|---|
| 5,270,558 | A * | 12/1993 | Reich et al. | 257/223 |
| 5,693,968 | A * | 12/1997 | Cherry et al. | 257/231 |
| 5,880,777 | A * | 3/1999 | Savoye et al. | 348/217.1 |
| 7,091,530 | B1 * | 8/2006 | Reich et al. | 257/222 |

* cited by examiner

*Primary Examiner*—Sara Crane
(74) *Attorney, Agent, or Firm*—AFMCLO/JAZ; William G. Auton

(57) ABSTRACT

The CCD image sensor addresses the problem of noise, due to background charge generated by Compton scattering of gamma rays. In applications, in which an imager must operate in a high-radiation environment, such background noise reduces the video signal/noise. This imager reduces the amount of charge collected from Compton events, while giving up very little sensitivity to photons in the visible/near IR.

3 Claims, 3 Drawing Sheets

IMAGE SENSOR WITH REDUCED SENSITIVITY TO GAMMA RAYS

STATEMENT OF GOVERNMENT INTEREST

The invention described herein may be manufactured and used by or for the Government for governmental purposes without the payment of any royalty thereon.

BACKGROUND OF THE INVENTION

The invention addresses the problem of noise due to background charge generated by Compton scattering of gamma rays. In applications in which an imager must operate in a high-radiation environment, such background noise reduces the video signal/noise. This imager reduces the amount of charge collected from Compton events, while giving up very little sensitivity to photons in the visible/near IR.

Low light image sensors can be subjected to effects of background noise of gamma rays. A prior art sensor of note is described in U.S. Pat. No. 5,880,777 and U.S. Pat. No. 5,270,558 issued to Eugene Savoye et al, and which are incorporated herein by reference.

There is no image sensor known to the inventors which is engineered specifically to address this problem. Among the ways which one could use existing technology for this purpose, is to operate an imager at very high frame rates and then reject pixels from each frame that are contaminated with extra charge. However, the desired image signal in each frame is reduced while being detected against a fixed (or more likely increased due to the higher bandwidth) noise floor, so that the overall signal/noise is reduced. APS sensors, on the other hand, have low sensitivity to gammas by virtue of their thin active layers, but this is at the expense of poor quantum efficiency. Here, we can maintain in principle, both high quantum efficiency, and low gamma sensitivity.

SUMMARY OF THE INVENTION

The present invention is a charge-coupled imaging device, which processes optical input signals into electronic output CCD signals, while minimizing contamination by gamma rays. The charge-coupled imaging device in one embodiment includes:

(1) A substrate, which has an optical input port side, which receives the optical input signals;
(2) An electronic shutter implant layer which, controls the flow of photo electrons created by the optical input signals from the substrate, with a controllable flow of output carriers;
(3) An array of pixel elements, each having a charge storage region, which receives the flow of output carriers from the electronic shutter, and having a set of charge-coupled device gate terminals, that output an electronic CCD signal;
(4) A buried channel layer, which is created in the substrate between the electronic shutter, and the set of charge-coupled device gate terminals, which are constructed on dielectric material with an electrostatic barrier, such that Compton scattering that occurs for gamma rays, that accompany the optical input signal, to create a drainable Compton charge to eliminate contaminating effects of gamma rays.

As described below in one embodiment, the set of charge-coupled device output terminals, include a drain terminal for eliminating the drainable Compton charge of the gamma rays, from desired outputs of electronic CCD signals. This invention applies also to so-called surface channel CCDs.

In the charge coupled imaging device, the buried channel layer has a carrier of the opposite type, as that of a substrate, with a higher dopant concentration as that of the substrate, so that all of the output carriers of the electronic shutter that represent the optical input signal, are stored in the depletion well regions of the array of pixel elements. This is a similar feature with the Reich patent.

These, and many other objects and advantages of the present invention, will be readily apparent to one skilled in the pertinent art from the following detailed description of a preferred embodiment of the invention, and the related drawings.

DETAILED DESCRIPTION OF THE PREFERRED EMBODIMENT

Image sensors that must operate in an environment of high fluxes of gamma rays, are faced with the problem of charge generated by such radiation, particularly when the sensor must operate at low light levels. The charge is generated by Compton scattering of the gamma radiation, and can amount to several thousand electrons per event. This background charge, constitutes a random signal, that degrades the image quality, and can compromise device performance in critical applications, such as missile seekers. The purpose of this memo, is to describe a CCD structure that can reduce the charge collected from Compton events, with minimal impact on the sensitivity, to visible and near-IR photons.

Figure 1:
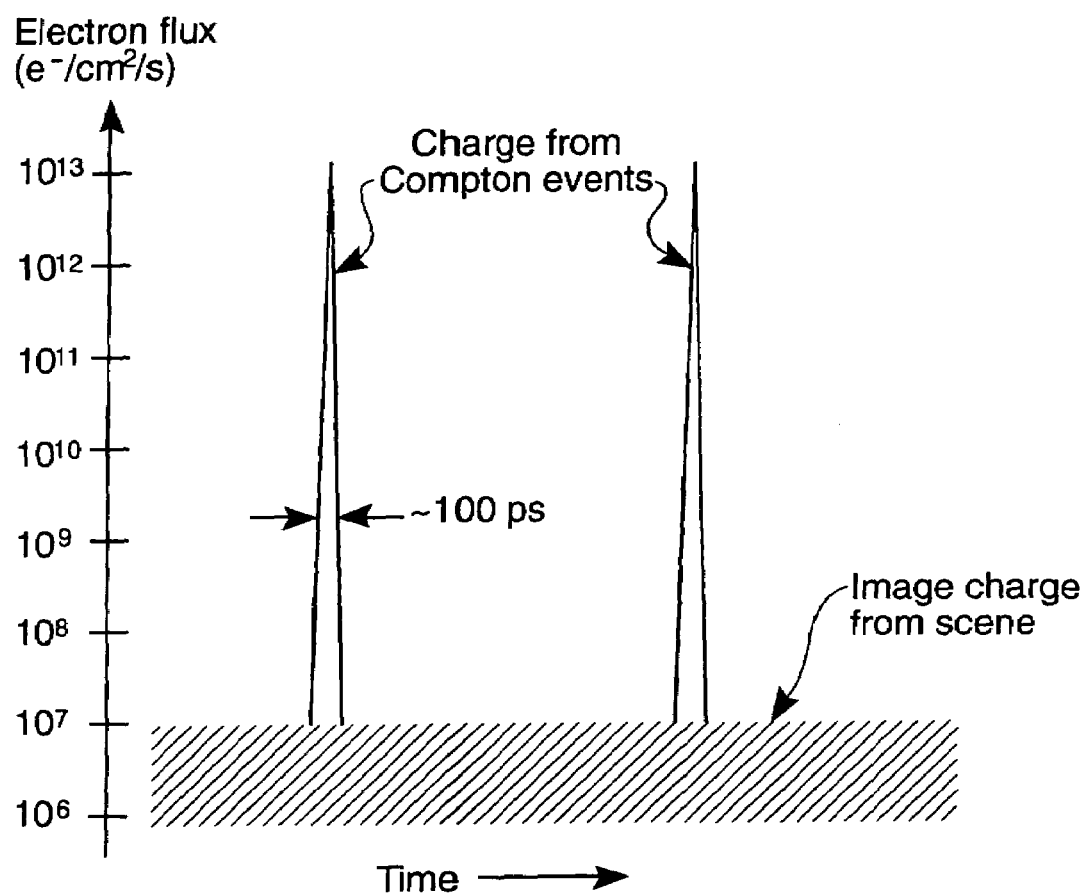
FIG. 1, is a chart comparing the charge generated by Compton scattering, versus the charge by an illuminated scene.

An important feature that distinguishes charge generated by Compton scattering from charge generating by an illuminated scene, is the temporal flux of charge (FIG. 1). A Compton event produces a burst of charge, which, for the case of a fully-depleted CCD, is collected in the CCD wells on a time scale of order 100 ps. By contrast, the photoelectron flux from a scene is relatively constant over a video frame, and is roughly six orders of magnitude lower than the peak current from the Compton charge. It is this fundamental difference in the electron flux rates, that forms the basis of the sensor described here.

Figure 2A:
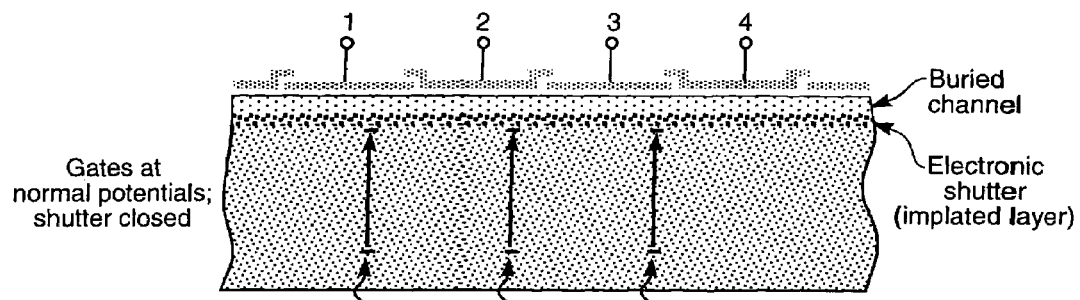
FIGS. 2a, 2b, and 2c show the cross section of the elements of the present invention.
Figure 2B:
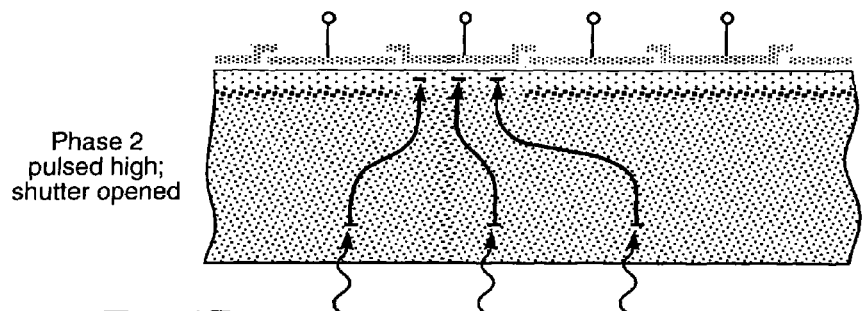
Figure 2C:
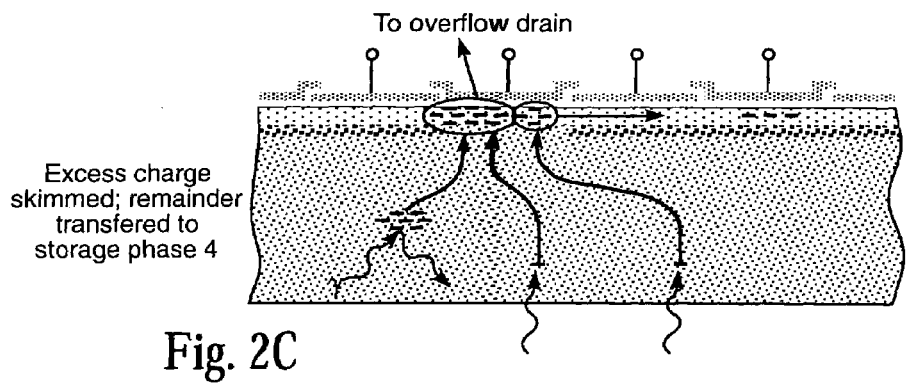

FIGS. 2a, 2b, and 2c illustrates in-cross-section, an example of an image sensor, incorporating the necessary structural elements. The device is a four-phase, buried channel CCD, and the view here is along the direction of charge transfer. The concepts shown here, can also be applied to active pixel sensors. A key element of the device, is the so-called electronic shutter, which controls the flow of carriers from the bulk to the CCD wells. It can be implemented by an ion-implanted layer beneath the charge collection region at the surface. The electronic shutter was designed to operate primarily with back-illuminated devices, such as the one illustrated here, but the gamma suppression technique, will also work with front illuminated devices.

Figure 3A:
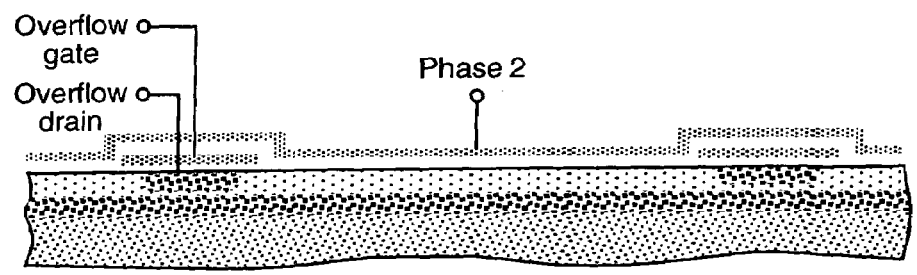
FIGS. 3a, 3b, and 3c are different views of the proposed invention.
Figure 3B:
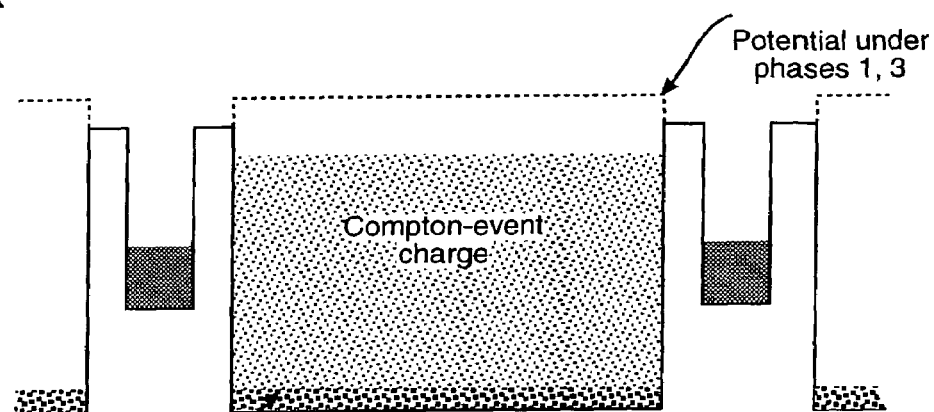
Figure 3C:
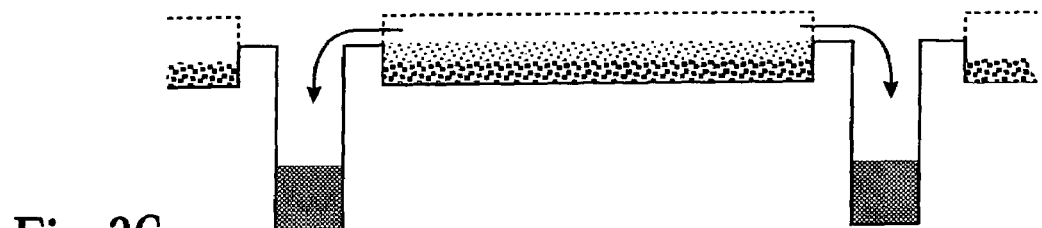

To admit carriers from the bulk into the CCD wells, the gate potential must be raised to a sufficient level to overcome the electrostatic barrier created by the shutter implant, as illustrated here for the case of phase 2. A gamma ray undergoing Compton scattering, creates a packet of charge, which we do not want to collect. To suppress collection of most of this charge, we perform the charge collection in two steps. In the first step, the shutter is opened under phase 2, and all the charge is collected in phase-2 well. In the second step, the phase-2 gate voltage is reduced in order to transfer the collected charge to either of two locations. This is illustrated in FIGS. 3a, 3b, and 3c, which shows a cross section of the proposed structure. Here, we show the conventional channel stops replaced by an overflow drain, and an overflow control gate, that sets a barrier potential between CCD channel, and overflow drain. The solid line in the potential diagram illustrates the electron potential under the phase-2 gate. During the photoelectron collection and Compton induced charge disposal times, phases 1 and 3 are set to a low, or blocking potential, illustrated by the dashed line, while the overflow control gate is biased just above this level. Phase 4 is set to high potential, to receive the desired photoelectrons from phase 2.

In the second step the phase-2, voltage is lowered to a level just above that of the overflow control gate. If the Compton-induced charge has been collected, this charge will mostly be skimmed off, and flow onto the overflow drain. To collect the desired photoelectron charge, the voltage on phase 3 is pulsed high to transfer the remaining charge to the phase-4 well. In order for this scheme to be effective, the two-step sequence must be repeated several times during the imager frame time, and in fact, the higher the repetition rate, the better the result.

This invention is intended to be an improvement on the system of R. K. Reich, B. B. Kosicki, and E. D. Savoye, "Integrated electronic shutter for charge-coupled devices," U.S. Pat. No. 5,270,558, Dec. 14, 1993 and has many common elements which are better described in that reference.

While the invention has been described in its presently preferred embodiment, it is understood, that the words which have been used, are words of description, rather than words of limitation, and that changes within the purview of the appended claims, may be made without departing from the scope and the spirit of the invention, in its broader aspects.

What is claimed is:

1. A charge-coupled imaging device which processes optical input signals into electronic output CCD signals while minimizing contamination by gamma rays, said charge-coupled imaging device comprising:
   a substrate, which has an optical input port side which receives the optical input signals;
   an electronic shutter implant layer which controls a flow of photoelectrons created by the optical input signals from the substrate with a controllable flow of output carriers;
   an array of pixel elements, each having a charge storage region which receives the flow of output carriers from the electronic shutter, and having a set of charge coupled device gate terminals that output an electronic CCD signal in response to the output carriers from the electronic shutter; and
   a buried channel layer which is fabricated in the substrate between the electronic shutter and the set of charge-coupled devices gate terminals that are constructed on a dielectric barrier such that Compton scattering occurs in gamma rays that accompany the optical input signal to create a drainable Compton charge to eliminate contaminating effects of gamma rays.

2. A charge-coupled imaging device, as defined in claim 1, wherein said set of charge coupled device gate terminals include a drain terminal for eliminating the drainable Compton charge of the gamma rays from desired outputs of electronic CCD signals.

3. A charge-coupled imaging device, as defined in claim 2, wherein the buried channel layer has a carrier of the opposite type as that of the substrate and with a higher dopant concentration as that of the substrate so that substantially all of the output carriers of the electronic shutter that represent the optical input signal are stored in the depletion well regions of the array of pixel elements.

* * * * *